(12) United States Patent
Banister et al.

(10) Patent No.: US 9,071,493 B2
(45) Date of Patent: Jun. 30, 2015

(54) DUAL FREQUENCY TRACKING LOOP FOR OFDMA SYSTEMS

(75) Inventors: Brian C. Banister, San Diego, CA (US); Shivratna G. Srinivasan, San Diego, CA (US); Matthias Brehler, Boulder, CO (US); Sunil Kumar Kandukuri Narayana, San Diego, CA (US); Raghu N. Challa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 334 days.

(21) Appl. No.: 12/824,958

(22) Filed: Jun. 28, 2010

(65) Prior Publication Data

US 2011/0158367 A1 Jun. 30, 2011

Related U.S. Application Data

(60) Provisional application No. 61/221,461, filed on Jun. 29, 2009.

(51) Int. Cl.
| | |
|---|---|
| *H03D 3/24* | (2006.01) |
| *H04L 27/26* | (2006.01) |
| *H03J 1/00* | (2006.01) |
| *H04L 27/00* | (2006.01) |

(52) U.S. Cl.
CPC ..... *H04L 27/2657* (2013.01); *H04L 2027/0065* (2013.01); *H03J 1/005* (2013.01); *H04L 2027/0055* (2013.01); *H04L 2027/0067* (2013.01)

(58) Field of Classification Search
CPC ................... H04L 27/2657; H04L 2027/0055; H04L 2027/0065
USPC .............. 375/376, 316, 326, 344, 355; 455/255–265, 75, 182.1, 182.2, 192.1, 455/192.2, 313–316
See application file for complete search history.

(56) References Cited

U.S. PATENT DOCUMENTS 6,266,361 B1 * 7/2001 Huang et al. .................. 375/140
6,330,291 B1 12/2001 Agrawal et al.
(Continued)

FOREIGN PATENT DOCUMENTS

| CN | 1586062 A | 2/2005 |
|---|---|---|
| CN | 1930841 A | 3/2007 |

(Continued)

OTHER PUBLICATIONS

Lee et al. "Effect of Carrier Frequency Offset on OFDM Systems for Multipath Fading Channels", Globecom Nov. to Dec. 2004, pp. 3721-3725.*

(Continued)

*Primary Examiner* — Sophia Vlahos
(74) *Attorney, Agent, or Firm* — François A. Pelaez

(57) ABSTRACT

Methods and apparatus for correcting frequency errors between a carrier frequency of a signal received by a wireless device and a reference frequency local to the device. For certain aspects, such a method generally includes receiving a signal in a receiver having an LO producing a reference frequency, a radio frequency (RF) phase-locked loop (PLL), and a digital rotator, estimating a frequency difference between a carrier frequency of the received signal and the LO reference frequency, and applying the estimated frequency difference to the RF PLL and the digital rotator.

26 Claims, 7 Drawing Sheets

(56) References Cited

U.S. PATENT DOCUMENTS

| | | |
|---|---|---|
| 6,463,266 B1 | 10/2002 | Shohara |
| 6,704,555 B2 | 3/2004 | Sih et al. |
| 6,738,608 B2 | 5/2004 | Black et al. |
| 6,816,716 B2 * | 11/2004 | Shohara ............... 455/196.1 |
| 7,099,642 B2 | 8/2006 | Fernandez-Corbaton et al. |
| 7,251,467 B2 | 7/2007 | Sendonaris et al. |
| 7,616,935 B2 | 11/2009 | Fernandez-Corbaton et al. |
| 7,889,819 B2 * | 2/2011 | Mody et al. .................. 375/344 |
| 8,355,455 B2 * | 1/2013 | Mansour et al. ............. 375/260 |
| 2003/0087617 A1 * | 5/2003 | Shohara ............... 455/192.2 |
| 2003/0128678 A1 * | 7/2003 | Subrahmanya et al. ...... 370/335 |
| 2005/0152326 A1 * | 7/2005 | Vijayan et al. ................ 370/343 |
| 2007/0104298 A1 * | 5/2007 | Filipovic et al. ............. 375/344 |
| 2007/0173203 A1 * | 7/2007 | Fei et al. ....................... 455/69 |
| 2007/0183484 A1 * | 8/2007 | Brehler et al. ............... 375/148 |
| 2008/0019427 A1 | 1/2008 | Riddle et al. |
| 2008/0085693 A1 * | 4/2008 | Harms ......................... 455/255 |
| 2008/0225990 A1 * | 9/2008 | Beukema et al. ............. 375/326 |

FOREIGN PATENT DOCUMENTS

| | | |
|---|---|---|
| EP | 1777831 | 4/2007 |
| JP | 2001148681 A | 5/2001 |
| JP | 2005518153 A | 6/2005 |
| JP | 2005348187 A | 12/2005 |
| JP | 2009545246 A | 12/2009 |
| TW | 200726153 | 7/2007 |
| WO | WO2008011606 | 1/2008 |
| WO | WO2008021810 | 2/2008 |

OTHER PUBLICATIONS

Lee et al. "Effect of Carrier Frequency Offset on OFDM Systems for Multipath Fading Channels", presentation slides for Globecom 2004, pp. 1-25.*

International Search Report and Written Opinion—PCT/US2010/040437, International Search Authority—European Patent Office—Sep. 28, 2010.

Taiwan Search Report—TW099121283—TIPO—May 2, 2013.

* cited by examiner

DUAL FREQUENCY TRACKING LOOP FOR OFDMA SYSTEMS

CROSS-REFERENCE TO RELATED APPLICATION(S)

This application claims the benefit of U.S. Provisional Patent Application No. 61/221,461 entitled "Dual Frequency Tracking Loop for OFDMA Systems," filed on Jun. 29, 2009, which is expressly incorporated by reference herein in its entirety.

BACKGROUND

1. Field

Certain aspects of the present disclosure relate to wireless communication and, more particularly, to correcting frequency errors between a carrier frequency of a signal received by a wireless device and a reference frequency local to the device.

2. Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP Long Term Evolution (LTE) systems, and orthogonal frequency division multiple access (OFDMA) systems.

Generally, wireless multiple-access communication systems can simultaneously support communication for multiple mobile devices. Each mobile device can communicate with one or more base stations via transmissions on forward and reverse links The forward link (or downlink) refers to the communication link from base stations to mobile devices, and the reverse link (or uplink) refers to the communication link from mobile devices to base stations. Optimizations of network coverage and service quality are constant goals for wireless network operators.

SUMMARY

Certain aspects of the present disclosure generally relate to correcting the frequency error between a carrier frequency of a signal received by a wireless device and a local oscillator (LO) reference frequency provided on the device.

Certain aspects of the present disclosure provide a method for wireless communications. The method generally includes receiving a signal in a receiver having an LO producing a reference frequency and a radio frequency (RF) phase-locked loop (PLL), estimating a frequency difference between a carrier frequency of the received signal and the LO reference frequency, and applying the estimated frequency difference to the RF PLL. For certain aspects, the receiver includes a digital rotator, and applying the estimated frequency difference involves applying the estimated frequency difference to the RF PLL and the digital rotator.

Certain aspects of the present disclosure provide an apparatus for wireless communications. The apparatus generally includes a receiver for receiving a signal, at least one processor, and a memory coupled to the at least one processor. The receiver typically includes an LO producing a reference frequency and an RF PLL. The at least one processor is typically configured to estimate a frequency difference between a carrier frequency of the received signal and the LO reference frequency and to apply the estimated frequency difference to the RF PLL. For certain aspects, the receiver includes a digital rotator, and the at least one processor is configured to apply the estimated frequency difference by applying the estimated frequency difference to the RF PLL and the digital rotator.

Certain aspects of the present disclosure provide an apparatus for wireless communications. The apparatus generally includes means for receiving a signal—which typically includes an LO producing a reference frequency and an RF PLL—means for estimating a frequency difference between a carrier frequency of the received signal and the LO reference frequency, and means for applying the estimated frequency difference to the RF PLL. For certain aspects, the means for receiving includes a digital rotator, and the means for applying the estimated frequency difference is configured to apply the estimated frequency difference to the RF PLL and the digital rotator.

Certain aspects of the present disclosure provide a computer program product for wireless communications. The computer program product generally includes a computer-readable medium having code for receiving a signal in a receiver having an LO producing a reference frequency and an RF PLL; for estimating a frequency difference between a carrier frequency of the received signal and the LO reference frequency; and for applying the estimated frequency difference to the RF PLL. For certain aspects, the receiver has a digital rotator, and applying the estimated frequency differences involves applying the estimated frequency difference to the RF PLL and the digital rotator.

DETAILED DESCRIPTION

Figure 1:
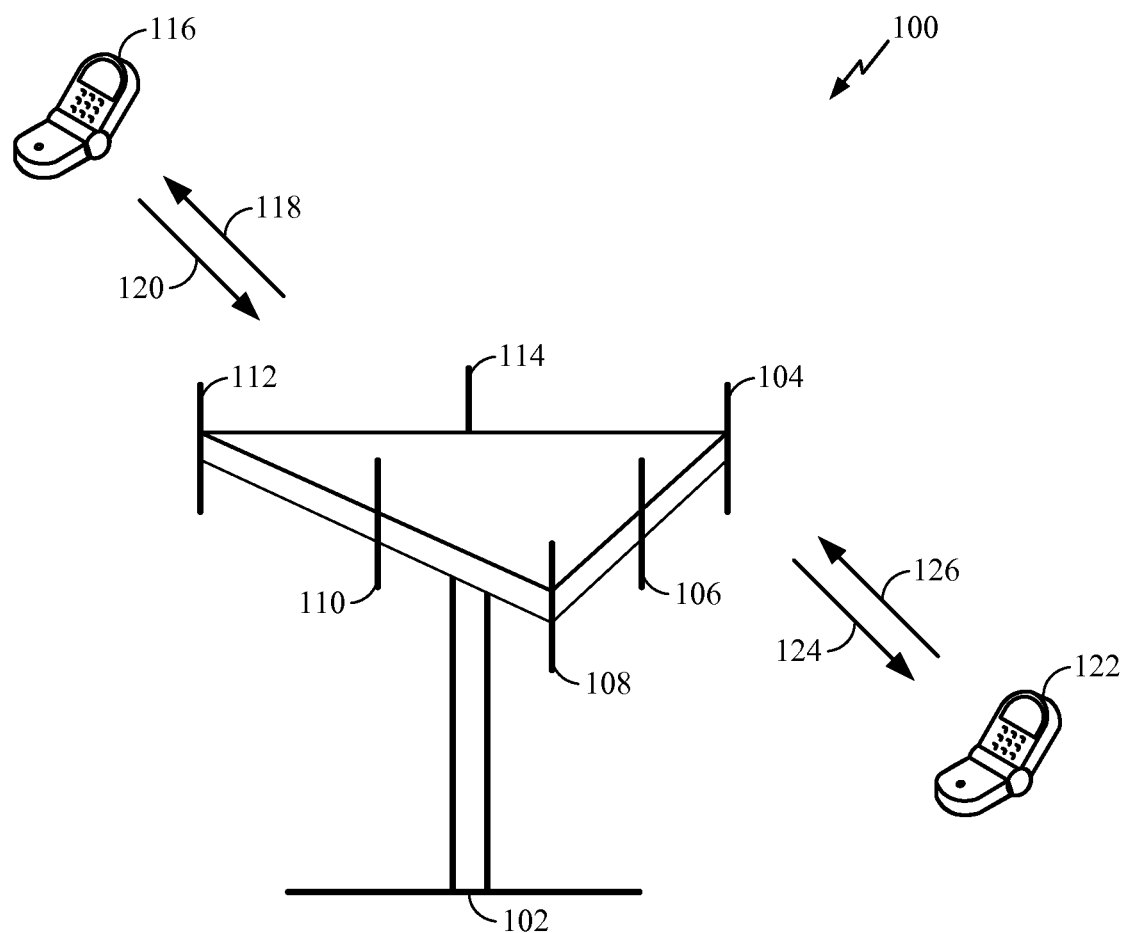
FIG. 1 illustrates an example multiple access wireless communication system in accordance with certain aspects of the present disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer-readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal. A terminal can also be called a system, device, subscriber unit, subscriber station, mobile station (MS), mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station (BS). A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, single-carrier FDMA (SC-FDMA) and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (Worldwide Interoperability for Microwave Access, or WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, IEEE 802.11 wireless local area network (WLAN), Bluetooth, and any other short- or long- range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

An Example Wireless Communication System

Referring now to FIG. 1, a wireless communication system 100 is illustrated in accordance with various embodiments presented herein. System 100 comprises a base station 102 that can include multiple antenna groups. For example, one antenna group can include antennas 104 and 106, another group can comprise antennas 108 and 110, and an additional group can include antennas 112 and 114. Two antennas are illustrated for each antenna group; however, more or fewer antennas can be utilized for each group. Base station 102 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 102 can communicate with one or more mobile devices such as mobile device 116 and mobile device 122; however, it is to be appreciated that base station 102 can communicate with substantially any number of mobile devices similar to mobile devices 116 and 122. Mobile devices 116 and 122 can be, for example, cellular phones, smart phones, laptops, handheld communication devices, handheld computing devices, satellite radios, global positioning system (GPS) devices, PDAs, and/or any other suitable device for communicating over wireless communication system 100. As depicted, mobile device 116 is in communication with antennas 112 and 114, where antennas 112 and 114 transmit information to mobile device 116 over a forward link 118 and receive information from mobile device 116 over a reverse link 120. Moreover, mobile device 122 is in communication with antennas 104 and 106, where antennas 104 and 106 transmit information to mobile device 122 over a forward link 124 and receive information from mobile device 122 over a reverse link 126. In a frequency division duplex (FDD) system, forward link 118 can utilize a different frequency band than that used by reverse link 120, and forward link 124 can employ a different frequency band than that employed by reverse link 126, for example. Further, in a time division duplex (TDD) system, forward link 118 and reverse link 120 can utilize a common frequency band and forward link 124 and reverse link 126 can utilize a common frequency band.

Each group of antennas and/or the area in which they are designated to communicate can be referred to as a sector of base station 102. For example, antenna groups can be designed to communicate to mobile devices in a sector of the areas covered by base station 102. In communication over forward links 118 and 124, the transmitting antennas of base station 102 can utilize beam-forming to improve signal-to-noise ratio of forward links 118 and 124 for mobile devices 116 and 122. This can be provided by using a precoder to steer signals in desired directions, for example. Also, while base station 102 utilizes beam-forming to transmit to mobile devices 116 and 122 scattered randomly through an associated coverage, mobile devices in neighboring cells can be subject to less interference as compared to a base station transmitting through a single antenna to all its mobile devices. Moreover, mobile devices 116 and 122 can communicate directly with one another using a peer-to-peer or ad hoc technology in one example.

Figure 2:
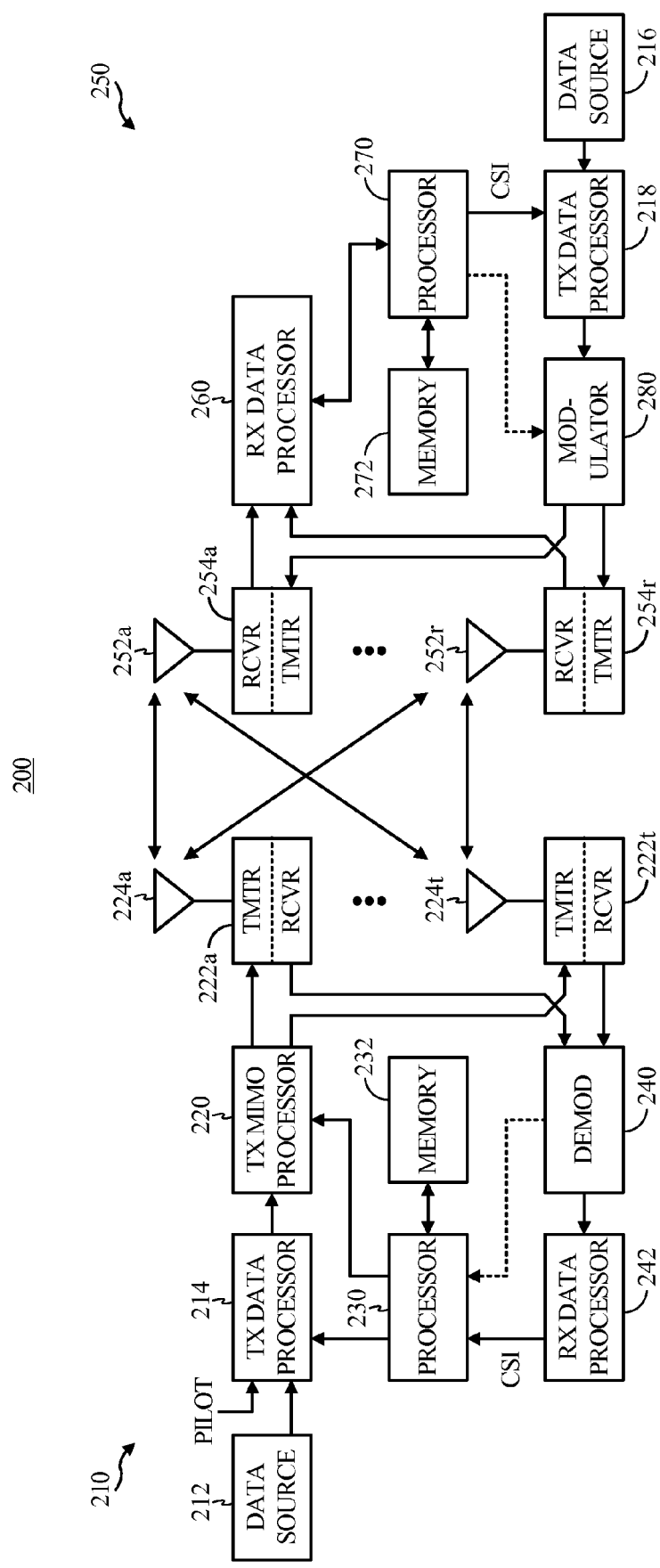
FIG. 2 illustrates a general block diagram of a communication system in accordance with certain aspects of the present disclosure.

FIG. 2 is a block diagram of a transmitter system 210 (also known as an access point) and a receiver system 250 (also known as an access terminal) in a MIMO system 200. At the transmitter system 210, traffic data for a number of data streams is provided from a data source 212 to a transmitter (TX) data processor 214.

In an embodiment, each data stream is transmitted from a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain embodiments, TX MIMO processor 220 applies beam-forming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210.

A processor 270 periodically determines which pre-coding matrix to use (discussed below). Processor 270 formulates a reverse link message comprising a matrix index portion and a rank value portion.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beam-forming weights and then processes the extracted message.

Figure 3:
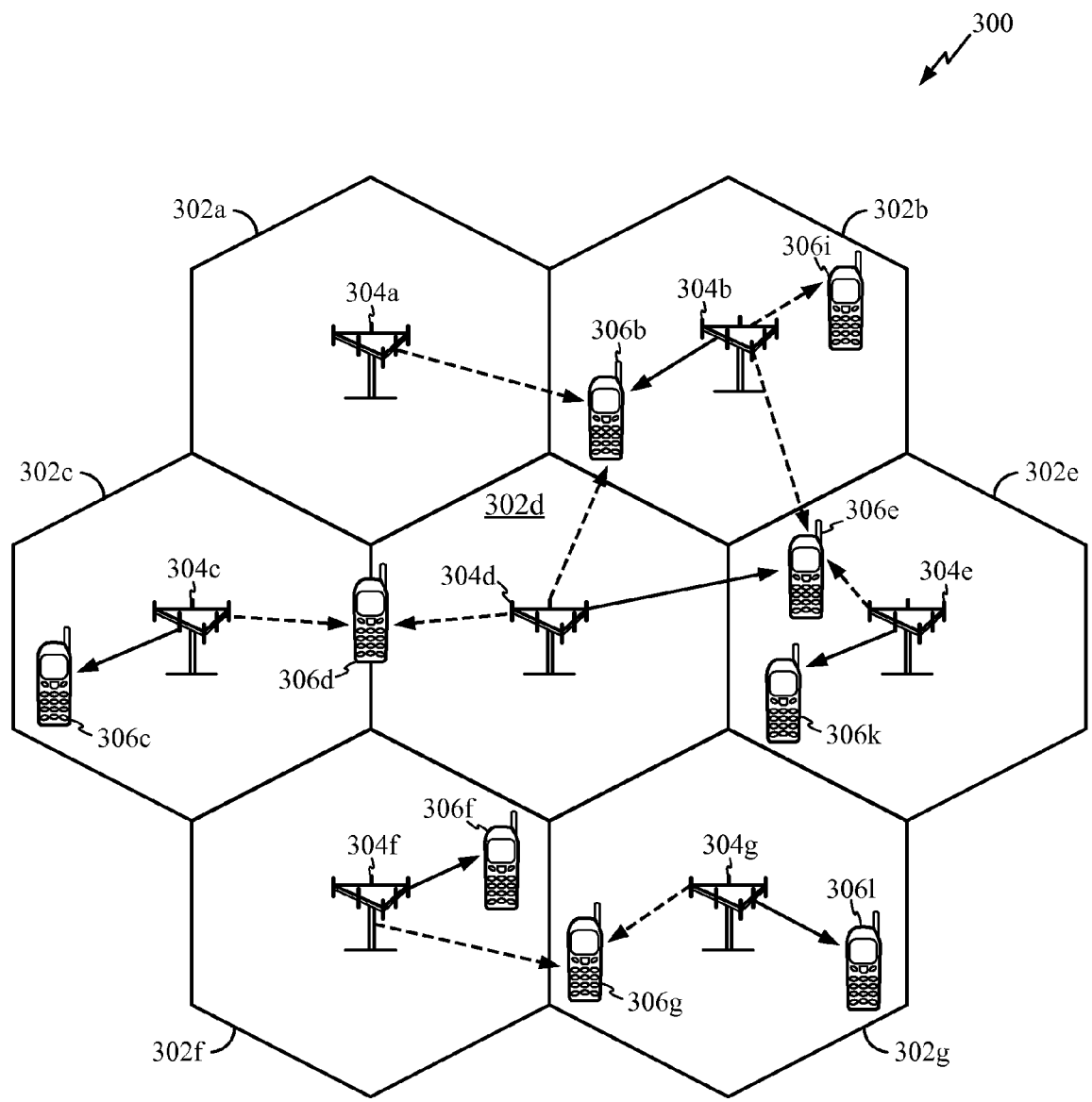
FIG. 3 illustrates an example wireless communication system in accordance with certain aspects of the present disclosure.

FIG. 3 illustrates an example wireless communication system 300 configured to support a number of users, in which various disclosed embodiments and aspects may be implemented. As shown in FIG. 3, by way of example, system 300 provides communication for multiple cells 302, such as macro cells 302a-302g, with each cell being serviced by a corresponding access point (AP) 304 (such as APs 304a-304g). Each cell may be further divided into one or more sectors (e.g., to serve one or more frequencies). Various access terminals (ATs) 306, including ATs 306a-306k, also known interchangeably as user equipment (UE) or mobile stations (MSs), are dispersed throughout the system. Each AT 306 may communicate with one or more APs 304 on a forward link (FL) and/or a reverse link (RL) at a given moment, depending upon whether the AT is active and whether it is in soft handoff, for example. The wireless communication system 300 may provide service over a large geographic region; for example, macro cells 302a-302g may cover a few blocks in a neighborhood.

An Example Dual Frequency Tracking Loop

Figure 4:
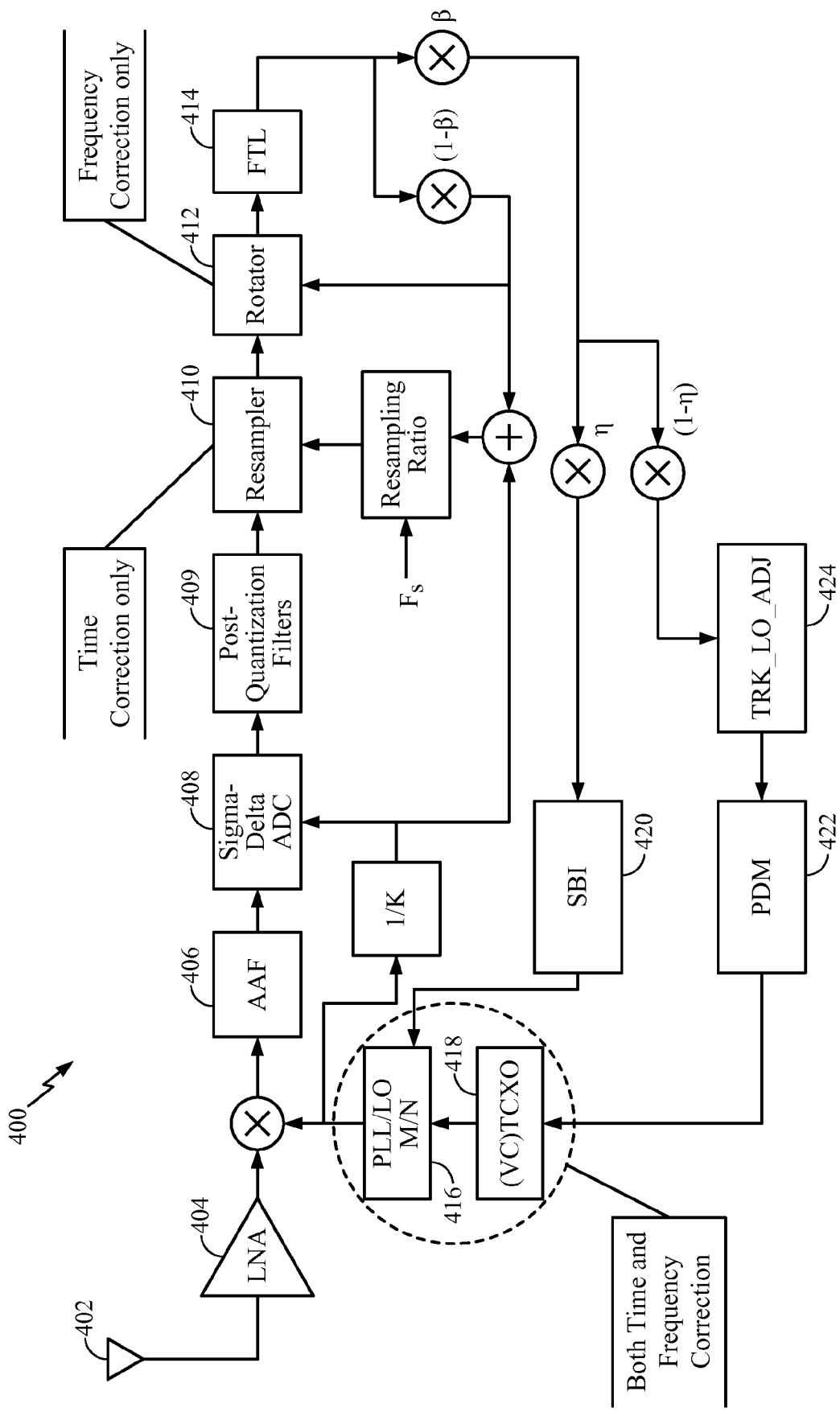
FIG. 4 illustrates an example block diagram of a receiver (Rx) chain with frequency and timing correction in accordance with certain aspects of the present disclosure.

FIG. 4 illustrates an example block diagram 400 of a receiver (Rx) chain in an AT 306 in accordance with certain aspects of the present disclosure. For certain aspects, the Rx chain may include a main clock provided by a crystal oscillator (XO), also referred to as a local oscillator (LO), outputting a square wave having a frequency of 750 MHz, for example. For other aspects, the main clock may be provided by a voltage-controlled temperature-controlled crystal oscillator (VCTCXO). For reasons described below, voltage control of the VCTCXO may be effectively disabled, so the VCTCXO is hereinafter referred to as the (VC)TCXO 418, as labeled in FIG. 4. For certain aspects, hardware (HW) support may be provided for both (VC)TCXO 418 and the XO, such that either the (VC)TCXO or the XO may be populated in the AT 306, or both oscillators may be populated with a switch dictating which oscillator provides the main clock.

Utilized for deriving various local clock frequencies used by the AT 306, the main clock may also be employed as a reference frequency signal for tracking a wireless network operating frequency (e.g., a carrier frequency). For example, when operating in an OFDMA system, the oscillator may introduce a frequency error of ±5 ppm. Methods and apparatus for handling this frequency error are described in detail below, but first, other components of the Rx chain are described.

The Rx chain may receive RF signals in the wireless system 300 via antenna 402. The received signals may be amplified by a low noise amplifier (LNA) 404 and downconverted using a signal from a phase-locked loop (PLL) 416. Clocks or other timing signals produced by the PLL 416 may be derived from the oscillator. For certain aspects, the PLL 416 may include an LO and, thus, may be referred to as a PLL/LO as shown. For other aspects, the PLL 416 may be based on an oscillator, such as an XO or a VCTCXO, separate from the PLL.

The downconverted signal may be filtered by an anti-aliasing filter (AAF) 406 before being digitized by an analog-to-digital converter (ADC) 408, such as a sigma-delta ADC. The sampling clock (F_ADC) for the analog-to-digital convertor (ADC) 408 may be derived from (e.g., divided down from, as shown by the factor K in FIG. 4) the PLL 416. After sampling, the digitized signal may be input to and processed by post-quantization filters 409, a resampler 410, and a rotator 412 (e.g., digital rotator) before reaching frequency tracking loop (FTL) logic 414.

As described above, the oscillator may introduce a frequency error of ±5 ppm. For certain aspects, an FTL (including the FTL logic 414) may be used to remove a residual frequency error due to the crystal oscillator after an initial frequency acquisition using reference signals, such as the primary synchronization signal (PSS) and the secondary synchronization signal (SSS). For certain aspects, an FTL algorithm estimates the frequency error between the carrier frequency of an incoming signal received at the access terminal 306 and a local reference frequency, such as the (VC)TCXO (or XO/LO as the case may be) reference frequency of the access terminal 306.

According to certain aspects, the purpose of the FTL is two-fold:
  The FTL removes the residual frequency error due to XO after initial frequency acquisition using the PSS & SSS; and
  In certain high-speed scenarios, high Doppler frequency manifests as a frequency offset. This frequency offset may most likely be compensated to avoid significant degradations in performance. This frequency error compensation may be applied to a serving cell and, in some situations, to neighboring cells, too.
For certain aspects, the signals used to eliminate the residual frequency offset may be the reference signals (RS) including the synchronization signals (PSS and SSS).

According to certain aspects, prior to the FTL, the residual frequency offset may be reduced to a small quantity. This may be done typically for two reasons. First, the physical broadcast channel (PBCH) decoding assumes coherent detection using an estimate of the channel from the RS symbols. For certain aspects, a small frequency error may induce a phase term that couples with the signal and causes attenuation. This may result in a loss in performance when using the coherent detection rule. Second, the frequency tracking loop converges fastest when the initial frequency error is small and within its pull-in range. During initial acquisition, the initial frequency offset may be brought down from up to ±5 ppm of the carrier frequency offset (e.g., up to 13.5 kHz) down to a small value (e.g., mean squared error <1 kHz) using the synchronization signals.

As part of the FTL, the output of the FTL logic 414 may be fed back to the rotator 412 in an effort to correct the frequency error. However, if the AT 306 has only an XO to generate the reference frequency signal, the XO itself cannot be adjusted. Therefore, as described above, certain aspects employ a (VC)TCXO 418 instead, such that the oscillator may be adjusted based on the output of the FTL logic 414. However, a VCTCXO is generally much more expensive and consumes substantially more power than an XO, so the VCTCXO may not be a viable option in the competitive wireless device market where cost and power draw are major concerns.

Accordingly, what is needed are techniques and apparatus for adequately correcting this frequency error at a lower cost and with less power draw than a VCTCXO solution.

To solve this problem, FIG. 4 illustrates a dual FTL, rather than the single FTL involving only the rotator 412. In the dual FTL, the frequency offset estimated by the FTL logic 414 may be applied to either the rotator 412 or to the PLL 416. For certain aspects, a portion ($\beta$) of the frequency error may be applied to the PLL 416, while a remaining portion ($1-\beta$) of the frequency error may be applied to the digital rotator. While $\beta$ may range from 0 to 1, $\beta$ is typically less than 0.5. By applying a portion of the frequency error to the PLL 416, both frequency and sampling time errors may be corrected. By using an XO rather than a VCTCXO, the dual FTL may represent the best tradeoff between cost, performance, and power consumption.

Figure 5:
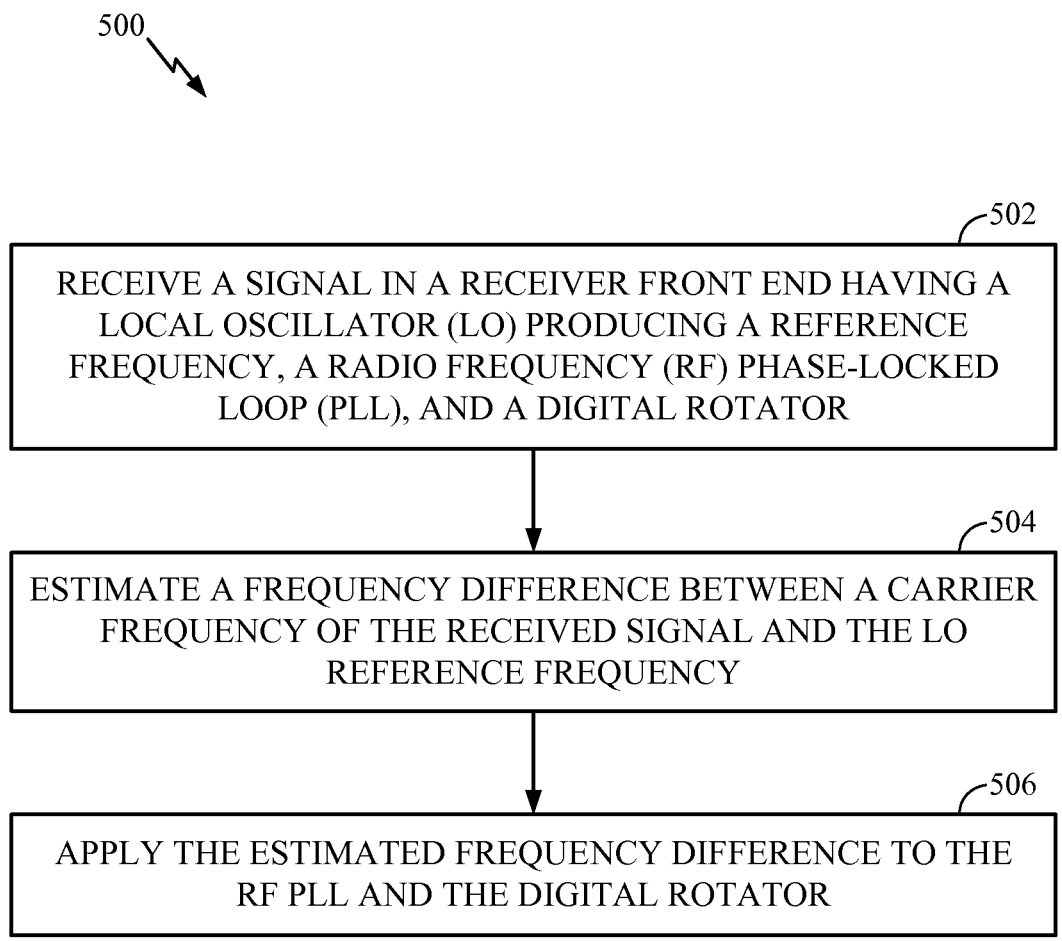
FIG. 5 illustrates example operations for correcting frequency errors between a carrier frequency of a signal received by an access terminal (AT) and a reference frequency local to the AT, in accordance with certain aspects of the present disclosure.

FIG. 5 illustrates example operations 500 for correcting frequency errors between a carrier frequency of a signal received by an AT 306 and a reference frequency local to the AT in accordance with certain aspects of the present disclosure. The operations 500 may begin, at 502, by receiving a signal in a receiver front end having a local oscillator (LO) producing a reference frequency, a radio frequency (RF) phase-locked loop (PLL), and a digital rotator. At 504, a frequency difference between a carrier frequency of the received signal and the LO reference frequency may be estimated.

At 506, the estimated frequency difference may be applied to the RF PLL and the digital rotator. For certain aspects, a portion ($\beta$) of the estimated frequency difference may be applied to the RF PLL, while a remaining portion ($1-\beta$) of the estimated frequency difference may be applied to the digital rotator. For other aspects, the estimated frequency difference may be applied only to the RF PLL.

As described in greater detail below with respect to FIGS. 6 and 7, changes to the digital rotator may typically be made every 1 ms based on an FTL discriminator in the FTL logic 414. The average of the digital rotator value may be transferred to the PLL 416 at a slower rate. This ensures that the average of the Doppler frequency is corrected by the PLL, while the residual Doppler frequency is corrected by the digital rotator 412. For example, while the update rate of the digital rotator may be every 1 ms, the PLL 416 may be updated every 10 to 20 ms. This compensation scheme may ensure that sampling-time error and frequency error are simultaneously rectified.

Also described in greater detail below with respect to FIG. 6, the Rx chain may provide for multiple correction mechanisms on the same AT 306. For example, the (VC)TCXO 418 or the PLL 416 may be used for both time and frequency correction, the resampler 410 may be used for time correction only, and the rotator 412 may be used for frequency correction only. Typically, one or more correction mechanisms in the Rx chain may be used, either in isolation or in combination with other correction mechanisms, in various modes of operation, in order to control frequency and sample-timing. Selection between these modes of operation generally dictates which correction mechanism (or combination of correction mechanisms) is used for frequency and sample-time correction. As illustrated in FIG. 4 (and FIG. 6), for frequency correction, the FTL logic's estimate of the frequency error may be split among the multiple correction mechanisms using the variables β and η. Once the FTL logic 414 estimates frequency offset, this or other logic may issue a frequency adjustment command to either the rotator 412 or the PLL 416. For some aspects, a frequency or sample-time correction through the PLL 416 may be programmed through a serial bus interface (SBI) 420, and a frequency or sample-time correction through the (VC)TCXO 418 may be programmed through the phase demodulator (PDM) 422 via a TRK_LO_ADJ block 424, as illustrated in FIG. 4. Since the output of the FTL logic 414 may be in units of Hz, the TRK_LO_ADJ block 424 may translate the output of the FTL logic into units suitable for controlling the (VC)TCXO 418, such as units of Hz/LSB (least significant bit).

Figure 6:
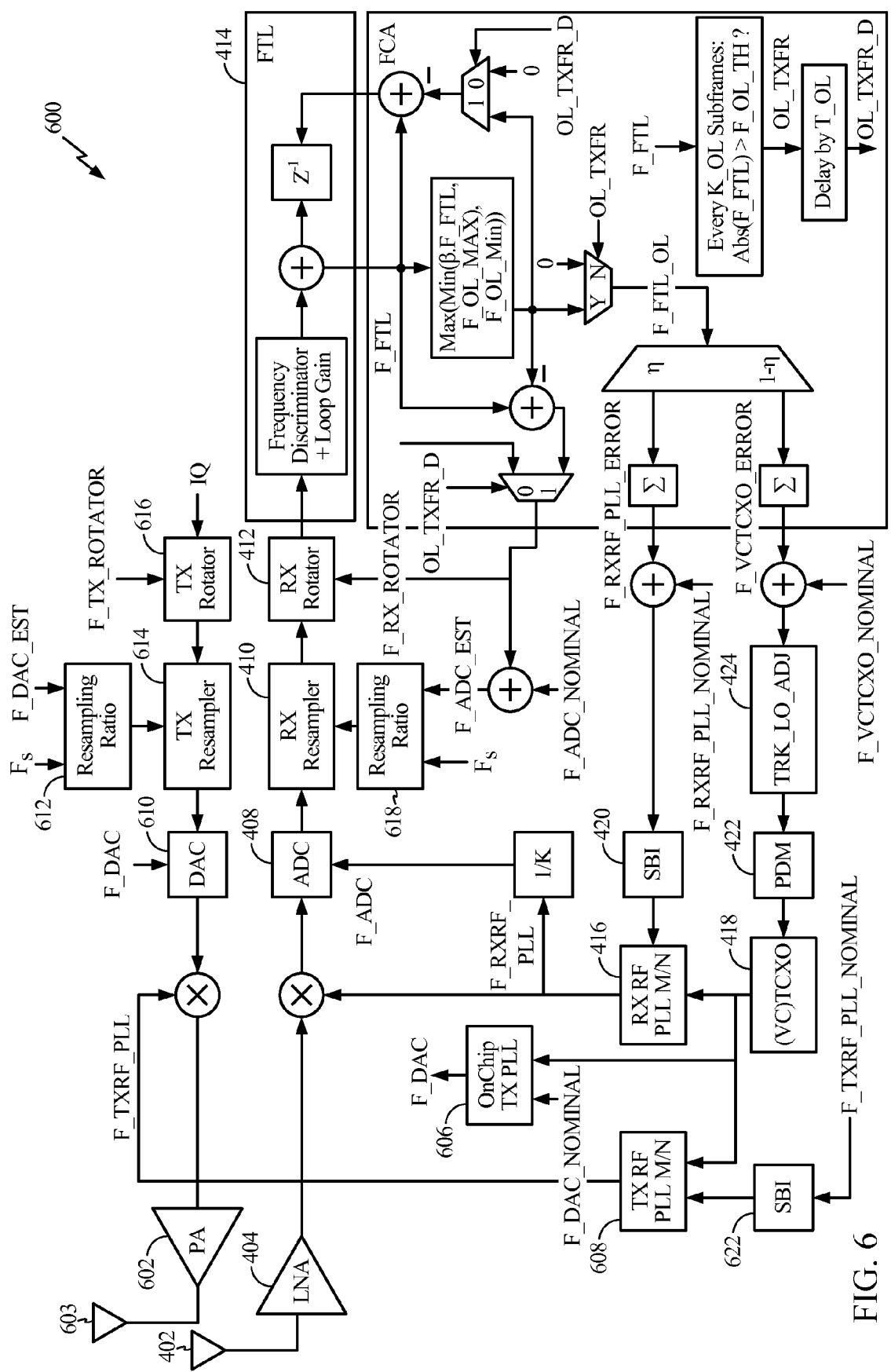
FIG. 6 illustrates an example block diagram of the receiver (Rx) chain and a transmitter (Tx) chain, with frequency and timing correction in accordance with certain aspects of the present disclosure.

FIG. 6 illustrates an example block diagram 600 of the receiver (Rx) chain and a transmitter (Tx) chain, with frequency and timing correction in accordance with certain aspects of the present disclosure. Block diagram 600 shows a high level conceptual look at different options available for frequency and sample-timing correction on the Rx and Tx chains. Much of the Rx chain in FIG. 4 is repeated in FIG. 6 with additional details, and therefore, only these additions are discussed in detail below.

In block diagram 600, the main clock reference may be provided by the (VC)TCXO 418. As described above, (VC) is parenthesized to illustrate the option of voltage controlling the VCTCXO or not, as well as the possibility of hardware support for any combination of a VCTCXO, an XO, or both in the AT 306. In the Rx chain, the sampling clock (F_ADC) for the ADC 408 may be derived from the RX RF PLL 416, which may also provide a reference (F_RXRF_PLL) for downconverting the received, amplified signal. F_RXRF_PLL may be derived indirectly from the (VC)TCXO 418 via the RX RF PLL 416.

According to certain aspects, the Rx chain includes multiple correction mechanisms. For example, the (VC)TCXO 418 or the RX RF PLL 416 may be used for both time and frequency correction, the RX Resampler 410 may be used for time correction only, and the RX rotator 412 may be used for frequency correction only.

Table 1 shows several correction mechanisms available for frequency and sample-time control.

TABLE 1

| Correction Mechanism | Freq Control Possible? | Timing Control Possible? | Control Mechanism | Notes |
| --- | --- | --- | --- | --- |
| VCTCXO | Yes | Yes | TRK_LO_ADJ and PDM | Oscillator's output frequency can be adjusted |
| XO | No | No | None | Lower cost and lower power than VCTCXO |
| Rx RF PLL | Yes | Yes | SBI | May be used in conjunction with XO (referred to as XO-PLL) |
| Rx Rotator | Yes | No | F_RX_ROTATOR | Allows correction of RX frequency error |
| Rx Resampler | No | Yes | $F_s$ and F_ADC_EST | Allows correction of RX timing/sampling error resulting from residual frequency error in frequency reference (VCTCXO or XO-PLL) |
| Tx Rotator | Yes | No | F_TX_ROTATOR | For TX frequency control |
| Tx Resampler | No | Yes | $F_s$ and F_DAC_EST | For TX sample-timing control |

Table 2 lists and describes the different variables and control signals included in FIG. 6.

TABLE 2

| Signal/Variable | Notes |
| --- | --- |
| F_RXRF_PLL | RX RF PLL output signal |
| F_TXRF_PLL | TX PLL output signal |
| F_DAC | DAC clock from on-chip TX PLL |
| F_ADC | ADC clock derived from RX RF PLL |
| F_FTL | Total residual frequency correction estimated by FTL logic |
| η | Binary flag to choose between VCTCXO or RX RF PLL |
| β | Fraction of frequency error to be transferred to outer loop |
| F_OL_MAX | Max outer loop frequency corrected at any given time |
| F_OL_MIN | Min outer loop frequency corrected at any given time |
| F_RX_ROTATOR | Rx Rotator correction |
| F_TX_ROTATOR | Tx Rotator correction |
| F_FTL_OL | Outer loop frequency correction |
| F_RXRF_PLL_ERROR | RX RF PLL correction |

TABLE 2-continued

| Signal/Variable | Notes |
| --- | --- |
| F_VCTCXO_ERROR | VCTCXO correction |
| F_ADC_EST | Estimated ADC clock frequency |
| F_DAC_EST | Estimated DAC clock frequency |
| K_OL | Outer loop update periodicity |
| OL_TXFR | Flag to indicate outer loop update |
| OL_TXFR_D | OL_TXFR delayed by T_OL |
| T_OL | Time taken by outer loop update to propagate to Rx Rotator |
| $F_s$ | Natural sampling rate |
| F_ADC_NOMINAL | Nominal ADC frequency |
| F_DAC_NOMINAL | Nominal DAC frequency |
| F_TXRF_PLL_NOMINAL | Nominal TX RF PLL frequency |
| F_RXRF_PLL_NOMINAL | Nominal RX RF PLL frequency |
| F_VCTCXO_NOMINAL | Nominal VCTCXO frequency |

Frequency and Timing Correction Options for RX

As discussed above, one or more correction mechanisms in the Rx chain may be used, either in isolation or in combination with other blocks, in various modes of operation, in order to control frequency and sampling-timing. The mode of operation generally determines which correction mechanism (or combination of correction mechanisms) is used for frequency and sample-time correction. For certain aspects, for frequency correction, the FTL logic's 414 estimate of the frequency error may be split among the multiple correction mechanisms via the variables β and η as shown in Table 3. For certain aspects, the RX resampler 410 may be used for sample-time correction when β≠1. For certain aspects, an AT 306 may support all three operating modes below to select between different correction mechanisms.

TABLE 3

| Operating Mode | η | β | Notes |
| --- | --- | --- | --- |
| Mode 1: XO + Rotator | 1 | 0 | Preferred when only an XO option is available (if there is no PLL correction possible or the PLL fails) |
| Mode 2: XO + RX RF PLL + Rotator | 1 | ≠0 | Preferred solution for balancing power + cost + performance + simultaneous modes |
| Mode 3: VCTCXO + Rotator | 0 | ≠0 | Preferred for performance (frequency accuracy) |

Mode 1

Using the XO and the RX rotator 412, Mode 1 is typically preferred when only an XO option is available or if the PLL correction mechanism is unavailable (e.g., due to PLL circuit failure). In Mode 1 the (VC)TCXO 418 is not selected or may not be populated in the AT 306. Mode 1 relies on the RX rotator 412 for frequency error correction. Since the RX rotator 412 only corrects for the frequency error, the resampling ratio 618 may also be adjusted to correct for sampling-time error. In this mode, β=0, and no correction is applied to either the RX RF PLL 416 or the (VC)TCXO 418. It may not matter what the value of η is.

Mode 2

Mode 2 uses the XO, the RX RF PLL 416, and the RX rotator 412 and may be the preferred option for most purposes. An XO solution may be preferred over a VCTCXO option because an XO provides for cost and power reduction compared to a VCTCXO. Furthermore, the PLL correction offers better performance (e.g., reduced frequency error) compared to the XO and rotator control of Mode 1 since the PLL correction allows alignment of a DC notch filter with the Long Term Evolution (LTE) Specification's DC tone where no data is transmitted. This may be particularly important for implementations which do not support any mechanism for zeroing-out log likelihood ratios (LLRs) from data tones that may be corrupted by the DC notch filter if there is a large uncorrected frequency error in the XO-PLL.

In Mode 2, the frequency correction may be applied through both the RX RF PLL 416 and the RX rotator 412. For certain aspects, correction through the RX RF PLL 416 takes place at a slower time scale (e.g., 100 ms), and correction through the RX rotator 412 occurs at a faster time scale (e.g., every 1 ms). Here, β≠0, for instance, and only a fraction (β) of the correction is applied through the RX RF PLL 416 via the SBI interface 420. The rest (1−β) may be applied through the RX rotator 412. In certain aspects, when β≠1, it may be necessary to apply both the time and frequency correction through the RX resampler 410 and the RX rotator 412, respectively. For certain aspects, the RX resampler 410 may be dynamically configurable to correct the sample-time error when at least a portion (1−β) of the frequency correction is applied to the RX rotator 412. For certain aspects, the RX resampler 410 need not be configurable when the frequency correction is applied solely to the RX RF PLL 416. For the correction applied through the RX RF PLL 416, both the time (e.g., clock or code Doppler) and frequency Doppler may be automatically corrected.

Mode 3

Mode 3 includes the VCTCXO 418 and RX rotator 412 correction. In this mode, the frequency correction may be applied through the VCTCXO 418 at a slower time scale, and through the RX rotator 412 at a faster time scale. The frequency correction through the VCTCXO 418 may be programmed via the PDM 422 by setting the TRK LO ADJ block 424 accordingly. When β≠0, both the time and frequency correction may be applied through the RX resampler 410 and the RX rotator 412, respectively. For the correction applied through the VCTCXO 418, both the clock and frequency errors may be corrected.

In certain aspects, a frequency correction algorithm (FCA) 620 may be used to transfer FTL correction (F_FTL) from the RX rotator 412 to the RX RF PLL 416 and/or the (VC)TCXO 418.

Frequency and Timing Correction Options for TX

In the Tx chain of the same AT 306, a digitally encoded and otherwise processed signal to be transmitted may be converted to an analog signal by a digital-to-analog converter (DAC) 610 and amplified by a power amplifier (PA) 602 before being transmitted from the AT 306 via an antenna 603. For certain aspects, the receive antenna 402 and the transmit antenna 603 may be the same antenna. A clock (F_DAC) for the DAC 610 may be derived from an on-chip TX PLL 606, which in turn may be derived from the (VC)TCXO 418 as shown. For certain aspects, there may be no firmware (FW) or software (SW) mechanism to update the on-chip TX PLL 606 other than to initialize this PLL with a nominal value (F_DAC_NOMINAL). Still, the on-chip PLL's frequency may depend on the (VC)TCXO 418. For certain aspects, the DAC clock for sampling the processed signal sequence to be transmitted may be derived directly or indirectly from the RX RF PLL 416.

F_DAC is typically independent of the mixing signal (F_TXRF_PLL) used for upconversion and produced by the transmitter radio frequency phase-locked loop (TX RF PLL) 608. F_TXRF_PLL may also be derived indirectly from the (VC)TCXO 418 via the TX RF PLL as depicted in FIG. 6.

For certain aspects, the TX RF PLL 608 may be adjusted via an SBI mechanism 622 similar to the SBI 420 used to update the RX RF PLL 416. However, a baseband DC correction may most likely adequately suppress the carrier feedthrough and, thus, may eliminate the need for aligning the DC-notch (whose bandwidth is 0 since this is a single number subtracted from IQ samples) with LTE-Specification-defined DC (i.e., there is no DC tone allocated in the TX side).

Table 4 illustrates options for adjusting the frequency and sample timing of the Tx chain based on the FTL correction modes for the Rx chain.

Furthermore, since the TX and RX have different subframe timelines, care should be taken when transferring automatic frequency control (AFC) error from RX to TX, especially in Mode 3 where AFC updates affect both RX and TX via the (VC)TCXO 418. The reason is that a large update to the (VC)TCXO 418 (aligned to RX subframe boundaries) can impact the TX subframes that may be straddling this update. This may limit the rate at which frequency error is transferred from RX Rotator 412 to the (VC)TCXO 418. For certain aspects, the rotator frequency (F_RX_ROTATOR, and consequently F_TX_ROTATOR) may be adjusted twice during a subframe via two time stamps. This mechanism may be used to transfer frequency between the Rx chain and the Tx chain. For other aspects, TX frame boundaries may be used to dictate the updates to the (VC)TCXO 418 such that the rotator update may be taken care of only one time.

Figure 7:
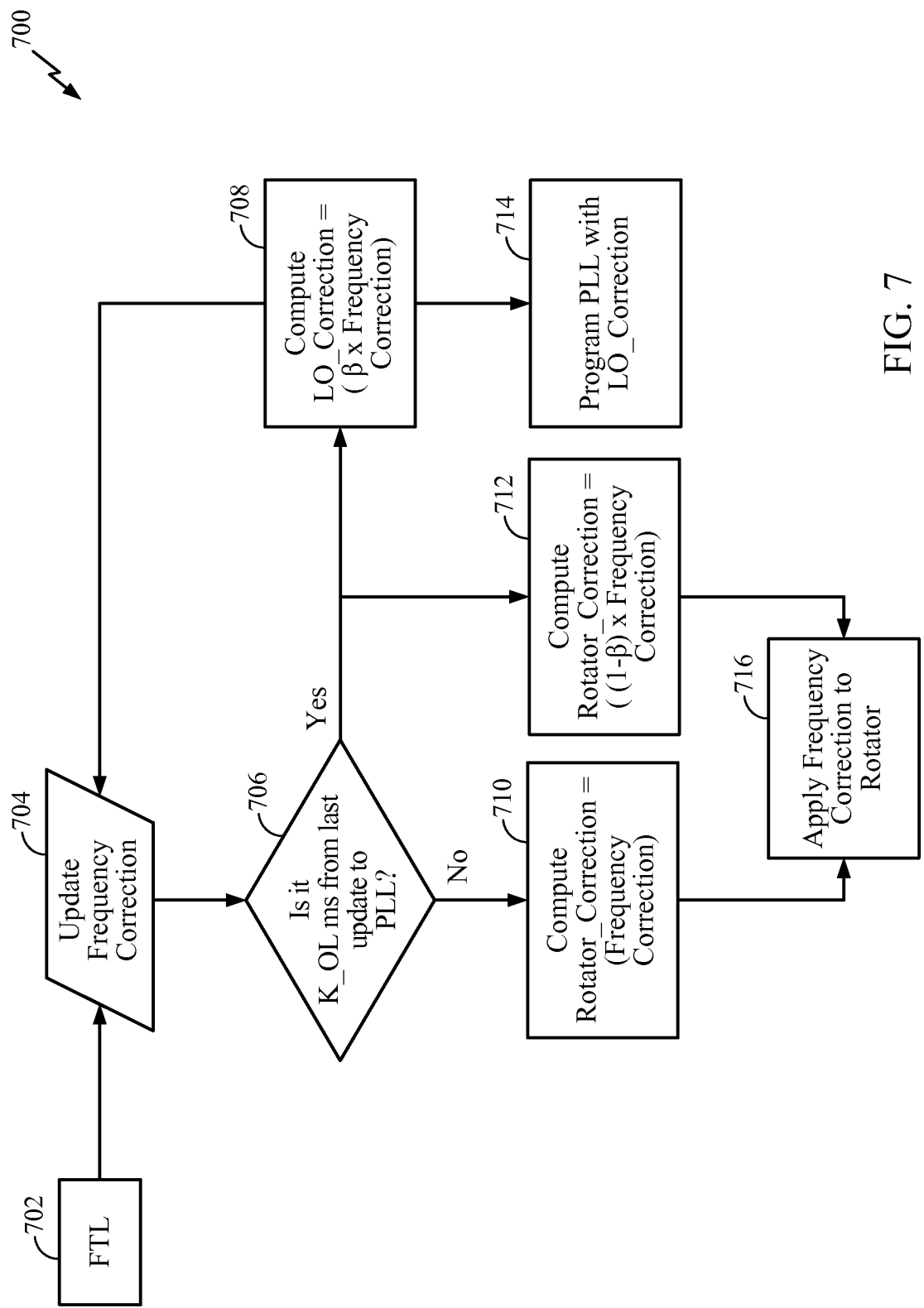
FIG. 7 illustrates example operations for performing a frequency correction algorithm in accordance with certain aspects of the present disclosure.

FIG. 7 illustrates example operations 700 for performing a frequency correction algorithm (e.g., FCA 620 in FIG. 6) in accordance with certain aspects of the present disclosure, such as when Mode 2 is being used or the Rx chain does not include a VCTCXO. A goal of the FCA is to transfer the FTL correction from the RX Rotator 412 to the RX RF PLL 416 or the (VC)TCXO 418 typically gradually via periodic updates whenever the rotator correction exceeds a threshold (F_OL_TH, or outer loop threshold frequency) checked every K_OL subframes. Balancing the costs of SBI 420 writes and how gradual (VC)TCXO adjustments may occur, the FTL correction may be applied to the RX RF PLL 416 every K_OL=100 ms, for example. For other aspects, K_OL may equal 10 ms or 20 ms, for example. According to certain aspects, F_OL_TH may depend on various factors, such as how much the RX RF PLL 416 may be adjusted without losing a lock (e.g., 20 kHz) and/or how gradually the (VC)TCXO 418 is designed to be adjusted.

At 704, the frequency correction (F_FTL) may be updated according to the FTL output 702 from the FTL logic 414. At 706, if K_OL ms have passed from the last update to the RX RF PLL 416, then at 708, LO_correction (F_RXRF_PLL_ERROR if η=1) may be computed as follows:

$$LO\_correction = \beta * Frequency\_correction \text{ (rounded to multiple of 8 Hz)}$$

TABLE 4

| RX Operating Mode | TX Rotator Correction F_TX_ROTATOR | TX Resampler Correction F_DAC_EST |
|---|---|---|
| Mode 1: XO + Rotator | F_RX_ROTATOR * µ | F_DAC_NOMINAL + F_RX_ROTATOR * µ |
| Mode 2: XO + RX RF PLL + Rotator | (F_RX_ROTATOR + F_RXRF_PLL_ERROR) * µ | F_DAC_NOMINAL + (F_RX_ROTATOR + F_RXRF_PLL_ERROR) * µ |
| Mode 3: VCTCXO + Rotator | F_RX_ROTATOR * µ | F_DAC_NOMINAL + F_RX_ROTATOR * µ |

In Table 4, µ=F_TXRF_PLL_NOMINAL/F_RXRF_PLL_NOMINAL is the ratio of uplink (UL) to downlink (DL) carrier frequencies. In summary, the TX Rotator 616 and TX resampler 614 may most likely account for the residual error not corrected by the (VC)TCXO 418 since such error may appear at both the TX RF PLL 608 and the on-chip TX PLL 606 and thereby affect F_TXRF_PLL and F_DAC, respectively. Specifically, any correction applied to the Rx RF PLL 416 in Mode 2 is not available for the Tx chain (since this portion of the correction was not applied to the (VC)TCXO 418) and thus is added back to F_RX_ROTATOR as shown in Table 4.

Once the LO_correction has been computed, the frequency correction may be updated again at 704, and at 714, the RX RF PLL may be programmed with the computed LO_correction. For certain aspects, the LO_Correction is applied to the RX RF PLL 416 only if the frequency correction is above a pre-determined threshold (F_OL_TH) of, for example, around 2 kHz.

At 712, the rotator correction (F_RX_ROTATOR) may be computed as follows and applied to the RX rotator 412 at 716:

$$Rotator\_correction = Frequency\_correction - LO\_correction = (1-\beta) * Frequency\_correction$$

At 706, if K_OL ms have not passed from the last update to the RX RF PLL 416, then at 710, the Rotator_correction may be computed as follows and applied to the RX rotator 412 at 716:

Rotator_correction=Frequency_correction

In other words, if K_OL ms have not passed, then only the RX rotator 412 is corrected according to F_FTL from the FTL logic 414. However, if K_OL ms have passed, then F_FTL may be applied to both the RX rotator 412 and to the RX RF PLL 416 according to the factor β.

For certain aspects, F_OL_MAX (outer loop maximum frequency correction) and F_OL_MIN (outer loop minimum frequency correction) may provide slew rate limiting of the frequency transfer to outer loop (the loop for adjusting the RX RF PLL or the (VC)TCXO 418). From a control theory perspective, these parameters may effectively define a second order FTL loop with a dominant inner loop pole to track short-term frequency changes and a weaker outer loop pole to track long-term frequency changes. These parameters may be carefully selected depending on constraints for PLL updates including speed, amount, settling time, and whether the frequency updates are required to be aligned to subframe boundaries at DL or UL.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine-readable medium and/or computer-readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disc storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for wireless communications, comprising:
receiving a signal in a receiver having a resampler, having a local oscillator producing a reference frequency, having a radio frequency phase-locked loop, and having a digital rotator;
estimating a frequency difference between a carrier frequency of the received signal and the local oscillator reference frequency;
applying a portion of the estimated frequency difference to the radio frequency phase-locked loop;
applying a remaining portion of the estimated frequency difference to the digital rotator; and
configuring the resampler based on the remaining portion of the estimated frequency difference applied to the digital rotator simultaneously with applying the portion of the estimated frequency difference to the radio frequency phase-locked loop and applying the remaining portion to the digital rotator.

2. The method of claim 1, wherein applying the portion of the estimated frequency difference comprises applying the portion of the estimated frequency difference to the radio frequency phase-locked loop less frequently than applying the remaining portion of the estimated frequency difference to the digital rotator.

3. The method of claim 1, wherein applying the portion of the estimated frequency difference comprises applying the portion of the estimated frequency difference to the radio frequency phase-locked loop only if the estimated frequency difference exceeds a threshold.

4. The method of claim 1, wherein applying the portion of the estimated frequency difference to the radio frequency phase-locked loop adjusts at least one of a clock frequency for a digital-to-analog converter in a transmitter or a frequency of a signal for upconversion.

5. The method of claim 1, further comprising deriving an analog-to-digital converter clock, for sampling the received signal, from the radio frequency phase-locked loop.

6. The method of claim 1, further comprising deriving a digital-to-analog converter clock, for sampling a signal sequence to be transmitted, from the radio frequency phase-locked loop.

7. An apparatus for wireless communications, comprising:
a receiver for receiving a signal, the receiver comprising:
a resampler;
a local oscillator producing a reference frequency;
a radio frequency phase-locked loop; and
a digital rotator; and
at least one processor configured to:
estimate a frequency difference between a carrier frequency of the received signal and the local oscillator reference frequency;
apply a portion of the estimated frequency difference to the radio frequency phase-locked loop;
apply a remaining portion of the estimated frequency difference to the digital rotator; and
correct a sampling time error by configuring the resampler based on the remaining portion of the estimated frequency difference applied to the digital rotator, wherein the at least one processor is configured to simultaneously correct the sampling time error and apply the portion of the estimated frequency difference and the remaining portion of the estimated frequency difference.

8. The apparatus of claim 7, wherein applying the portion of the estimated frequency difference comprises applying the portion of the estimated frequency difference to the radio frequency phase-locked loop less frequently than applying the remaining portion of the estimated frequency difference to the digital rotator.

9. The apparatus of claim 7, wherein applying the portion of the estimated frequency difference comprises applying the portion of the estimated frequency difference to the radio frequency phase-locked loop only if the estimated frequency difference exceeds a threshold.

10. The apparatus of claim 7, wherein applying the portion of the estimated frequency difference to the radio frequency phase-locked loop adjusts at least one of a clock frequency for a digital-to-analog converter in a transmitter or a frequency of a signal for upconversion.

11. The apparatus of claim 7, wherein the at least one processor is configured to derive an analog-to-digital converter clock, for sampling the received signal, from the radio frequency phase-locked loop.

12. The apparatus of claim 7, wherein the at least one processor is configured to derive a digital-to-analog converter clock, for sampling a signal sequence to be transmitted, from the radio frequency phase-locked loop.

13. An apparatus for wireless communications, comprising:
means for receiving a signal, comprising:
a local oscillator producing a reference frequency;
a radio frequency phase-locked loop; and
a digital rotator; and
means for estimating a frequency difference between a carrier frequency of the received signal and the local oscillator reference frequency;
means for applying a portion of the estimated frequency difference to the radio frequency phase-locked loop; and
means for applying a remaining portion of the estimated frequency difference to the digital rotator.

14. The apparatus of claim 13, wherein the means for applying the portion of the estimated frequency difference is configured to apply the portion of the estimated frequency difference to the radio frequency phase-locked loop less frequently than applying the remaining portion of the estimated frequency difference to the digital rotator.

15. The apparatus of claim 13, wherein the means for applying the portion of the estimated frequency difference is configured to apply the portion of the estimated frequency difference to the radio frequency phase-locked loop only if the estimated frequency difference exceeds a threshold.

16. The apparatus of claim 13, wherein the means for applying the portion of the estimated frequency difference to the radio frequency phase-locked loop adjusts at least one of a clock frequency for a digital-to-analog converter in a means for transmitting or a frequency of a signal for upconversion.

17. The apparatus of claim 13, further comprising means for correcting a sampling time error simultaneously with applying the portion of the estimated frequency difference to the radio frequency phase-locked loop and applying the remaining portion to the digital rotator.

18. The apparatus of claim 17, wherein the means for receiving the signal comprises a resampler and wherein the means for correcting the sampling time error configures the resampler based on the remaining portion of the estimated frequency difference applied to the digital rotator.

19. The apparatus of claim 13, further comprising means for deriving an analog-to-digital converter clock, for sampling the received signal, from the radio frequency phase-locked loop.

20. The apparatus of claim 13, further comprising means for deriving a digital-to-analog converter clock, for sampling a signal sequence to be transmitted, from the radio frequency phase-locked loop.

21. A computer program product for wireless communications, comprising:
a non-transitory computer-readable medium having code for causing a computer to perform a method, the method comprising:
receiving a signal in a receiver having a resampler, having a local oscillator producing a reference frequency, having a radio frequency phase-locked loop, and having a digital rotator;
estimating a frequency difference between a carrier frequency of the received signal and the local oscillator reference frequency;
applying a portion of the estimated frequency difference to the radio frequency phase-locked loop;
applying a remaining portion of the estimated frequency difference to the digital rotator; and
configuring the resampler based on the remaining portion of the estimated frequency difference applied to the digital rotator simultaneously with applying the portion of the estimated frequency difference to the radio frequency phase-locked loop and applying the remaining portion to the digital rotator.

22. The computer program product of claim 21, wherein applying the portion of the estimated frequency difference comprises applying the portion of the estimated frequency difference to the radio frequency phase-locked loop less frequently than applying the remaining portion of the estimated frequency difference to the digital rotator.

23. The computer program product of claim 21, wherein applying the portion of the estimated frequency difference comprises applying the portion of the estimated frequency difference to the radio frequency phase-locked loop only if the estimated frequency difference exceeds a threshold.

24. The computer program product of claim 21, wherein applying the portion of the estimated frequency difference to the radio frequency phase-locked loop adjusts at least one of a clock frequency for a digital-to-analog converter in a transmitter or a frequency of a signal for upconversion.

25. The computer program product of claim 21, wherein the method further comprises deriving an analog-to-digital converter clock, for sampling the received signal, from the radio frequency phase-locked loop.

26. The computer program product of claim 21, wherein the method further comprises deriving a digital-to-analog converter clock, for sampling a signal sequence to be transmitted, from the radio frequency phase-locked loop.

* * * * *